United States Patent
Högerl et al.

(10) Patent No.: US 7,500,305 B2
(45) Date of Patent: Mar. 10, 2009

(54) PLACEMENT SYSTEM FOR POPULATING A SUBSTRATE WITH ELECTRONIC COMPONENTS

(75) Inventors: Jürgen Högerl, Regensburg (DE); Jens Pohl, Bernhardswald (DE); Uta Sasse, Feldkirchen-Westerham (DE); Ingo Wennemuth, München (DE)

(73) Assignee: Qimonda AG, Munich (DE)

( * ) Notice: Subject to any disclaimer, the term of this patent is extended or adjusted under 35 U.S.C. 154(b) by 182 days.

(21) Appl. No.: 11/348,762

(22) Filed: Feb. 7, 2006

(65) Prior Publication Data

US 2006/0123624 A1  Jun. 15, 2006

Related U.S. Application Data (60) Division of application No. 10/700,087, filed on Nov. 3, 2003, now Pat. No. 7,069,647, which is a continuation of application No. PCT/DE02/01523, filed on Apr. 25, 2002.

(30) Foreign Application Priority Data

May 3, 2001 (DE) ................................. 101 21 578

(51) Int. Cl.
  *B23P 19/00* (2006.01)
(52) U.S. Cl. .......................................... 29/740; 29/700
(58) Field of Classification Search ............. 29/700, 29/740
  See application file for complete search history.

(56) References Cited

U.S. PATENT DOCUMENTS 3,785,507 A * 1/1974 Wiesler et al. ............. 29/700
3,973,682 A * 8/1976 Neff ........................ 414/627
4,703,965 A * 11/1987 Lee et al. .................. 294/64.1
4,829,665 A * 5/1989 Kabeshita et al. ........... 29/840
4,850,780 A * 7/1989 Safabakhsh et al. ....... 414/416.1
4,852,247 A * 8/1989 Hawkswell ................. 29/740
4,990,051 A * 2/1991 Safabakhsh et al. ........ 156/344
5,203,143 A   4/1993 Gutentag
5,803,797 A * 9/1998 Piper ........................ 451/182
5,894,657 A * 4/1999 Kanayama et al. ........... 29/740
5,950,613 A * 9/1999 Wark et al. .................. 125/35
6,706,130 B1  3/2004 Minamitani et al.
2002/0177875 A1 11/2002 Tsui et al.
2004/0111875 A1 6/2004 Hogeri et al.

FOREIGN PATENT DOCUMENTS

DE       37 40 594 C2   6/1988
DE       198 22 512 A1  10/1999
JP       01081336 A     3/1989

\* cited by examiner

*Primary Examiner*—C. J Arbes
(74) *Attorney, Agent, or Firm*—Laurence A. Greenberg; Werner H. Stemer; Ralph E. Locher (57) ABSTRACT

A novel method and placement system are configured for populating a substrate with an electronic component. The placement system has a substrate holding device for receiving the substrate, a wafer holding device above the substrate holding device serving for receiving a wafer holding frame, and a vacuum forceps holding device arranged above the wafer holding device. The wafer holding frame can receive a complete semiconductor wafer divided into electronic components.

18 Claims, 3 Drawing Sheets

PLACEMENT SYSTEM FOR POPULATING A SUBSTRATE WITH ELECTRONIC COMPONENTS

CROSS-REFERENCE TO RELATED APPLICATIONS

This is a division of application Ser. No. 10/700,087, filed Nov. 3, 2003 now U.S. Pat. No. 7,069,647; which was a continuing application, under 35 U.S.C. §120, of International application PCT/DE02/01523, filed Apr. 25, 2002; the application also claims the priority, under 35 U.S.C. §119, of German patent application DE 101 21 578.9, filed May 3, 2001; the prior applications are herewith incorporated by reference in their entirety.

BACKGROUND OF THE INVENTION

Field of the Invention

The invention relates to a placement system for populating a substrate with electronic components.

The further processing of electronic components, which have a semiconductor chip of a semiconductor wafer is relatively complex even if the semiconductor wafer already has the external contacts of the electronic components on its active top side. Firstly, the semiconductor wafer on a corresponding carrier is divided into electronic components. Afterward, the electronic components of the divided semiconductor wafer are detached from the carrier and introduced in a packaging or transport belt in a positionally true manner. The transport belt is supplied to an automatic placement machine. The individual electronic components are successively removed from the transport belt in order to populate a substrate with an electronic component in the automatic placement machine.

The multiple relocation of the electronic component of a semiconductor wafer divided into electronic components has the disadvantage that a removal device is used for the positionally true transfer of the electronic component of a semiconductor wafer divided into electronic components into a transport belt and, after transport, a removal device is again provided, which supplies the electronic component to the automatic placement machine. In order to comply with the positionally true introduction into the automatic placement machine, the devices used for removal and for transport are high-precision and correspondingly expensive automatic machines. Furthermore, the production sequence is relatively complex because the electronic component of a semiconductor wafer separated into electronic components passes through a plurality of processing steps before the placement on the substrate can take place in a positionally true manner.

SUMMARY OF THE INVENTION

It is accordingly an object of the invention to provide a placement system for populating a substrate with electronic components which overcome the above-mentioned disadvantages of the heretofore-known devices and methods of this general type and which simplify production and which provide for a method and a placement system for populating a substrate with electronic components which more rapidly and more effectively enable relocation of an electronic component from a semiconductor wafer divided into electronic components to a substrate.

With the foregoing and other objects in view there is provided, in accordance with the invention, a placement system for populating a substrate with at least one electronic component of a semiconductor wafer divided into electronic components, the placement system comprising:

a substrate holding device for receiving the substrate;

a wafer holding device disposed above the substrate holding device and adapted to receive a wafer holding frame;

the substrate holding device and the wafer holding device being disposed to be positioned with respect to one another horizontally in an X direction and a Y direction;

a vacuum forceps holding device disposed above the wafer holding device, the vacuum forceps holding device having a vacuum forceps, which can be finely adjusted in the X direction and the Y direction with regard to the substrate holding device and disposed to be rotatable and finely adjustable about a Z axis extending in a Z direction; and the vacuum forceps holding device being configured to move the vacuum forceps, in a region of the wafer holding frame, vertically in the Z direction into a rest position, into a preliminary position, and into a mounting position.

With the above and other objects in view there is also provided, in accordance with the invention, a method for populating a substrate with electronic components. The novel method has the following method steps:

provision of a wafer holding frame with a perforated film clamped in the wafer frame;

provision of a substrate with predetermined positions for the application of an electronic component;

supply of the wafer holding frame into a positioning wafer holding device and of the substrate into a positioning substrate holding device;

horizontal orientation in the X and Y directions of the wafer holding device and of the substrate holding device with respect to one another into a predetermined position for positioning an electronic component of the electronic components of the semiconductor wafer on the substrate;

movement of a vacuum forceps by means of a vacuum forceps holding device with monitoring by a component position identification device from a rest position vertically in the Z direction to a passage opening in the perforated film while carrying along an electronic component on a preliminary position and taking of the electronic component into a mounting position on the substrate with rotation about the Z axis and fine adjustment of the vacuum forceps in the X and Y directions.

The method has the advantage that the intermediate steps for the positionally true population of a transport belt with electronic components and the positionally true removal of the components from the transport belt and the supply of the individual components to an automatic placement machine are obviated. Rather, in an advantageous manner, the carrier on which the semiconductor wafer having electronic components has been divided into electronic components is used directly as a wafer holding frame in order, on the one hand, to carry out functional tests still required at the wafer level at the divided electronic components and, on the other hand, to supply the entire wafer holding frame, on which, after the semiconductor wafer has been divided into electronic components, the individual components are arranged in a positionally true manner, directly to a placement system.

The electronic component is relocated only once in this method, namely from the wafer-carrying film of the wafer holding frame to the mounting position on the substrate. At the same time, the wafer holding frame can both be used in a separating device for the wafer for separating the semiconductor wafer into individual electronic components, and can also be used in the placement system, which is equipped with a positioning wafer holding device into which the wafer holding frame can be directly inserted after a transport as well.

The perforated film has passage openings arranged in individual rows and columns, the perforated film being placed onto the semiconductor wafer in such a way that an electronic component of a semiconductor wafer separated into electronic components is arranged under each passage opening of the film. This arrangement may be formed even before the semiconductor wafer is separated into individual electronic components on a correspondingly perforated film. This has the advantage that the position and the orientation of the electronic component does not change from the separation of the semiconductor wafer into electronic components up to the population of a substrate with an electronic component.

For the horizontal orientation of the wafer holding frame in the positioning wafer holding device and of the substrate on the positioning substrate holding device, in a preferred exemplary implementation of the method, the two may be displaced one above the other horizontally in the X direction and in the Y direction until a functional electronic component of the semiconductor wafer is positioned above the mounting position on the substrate.

In a preferred embodiment of the method, the vacuum forceps may be arranged in its vacuum forceps holding device above the wafer holding frame in a rest position and be moved after the orientation of wafer holding device and substrate holding device in the vertical Z direction into a preliminary position at which the vacuum forceps of the vacuum forceps holding device receives an electronic component and, in the further course of the placement method, brings said electronic component into a mounting position on the substrate. In this mounting position, the vacuum forceps holding device can finely adjust the vacuum forceps in the X direction and in the Y direction and compensate for rotational errors of the electronic component relative to the position on the substrate by rotation about the Z axis. By virtue of the combination of rotational movement about the Z axis and displacement movement in the X and Y directions, in the region of the passage opening of the film, the vacuum forceps can perform a fine adjustment and position the electronic component exactly on the predetermined position on the substrate.

In a further exemplary implementation of the method, the substrate is heated in order to connect external contacts of the electronic component to contact pads of the substrate after exact positioning. Connection of this type may be effected in a curing of an electrically conductive adhesive prepared on the contact pads, or by soldering the external contacts of the electronic component on the contact pads of the substrate.

In accordance with a further exemplary implementation of the method, it is provided that, even before the semiconductor wafer is separated into electronic components, the as yet unseparated semiconductor wafer is applied to a side of the perforated film that is coated with adhesive. To that end, the electronic components of the semiconductor wafer that are arranged in rows and columns are oriented with the passage openings of the perforated film that are arranged in rows and columns. This orientation is performed in such a way that an individual electronic component is arranged on a passage opening of the film. In this case, the area of the passage opening of the film is less than the area of the electronic component, so that, after the semiconductor wafer has been separated into electronic components, none of the electronic components can fall through one of the passage openings.

When the unseparated semiconductor wafer is applied to the perforated film, said film may already be clamped in the wafer holding frame, so that the wafer holding frame may simultaneously be used as a wafer holder for a separating device.

In a further exemplary implementation of the method, it is only after the semiconductor wafer has been separated into electronic components that the film with the electronic component is clamped into the wafer frame. In this embodiment of the invention, the wafer holding frames differ in terms of their size and their form for the separation method from the wafer holding frames for the placement method.

In a further exemplary implementation of the method, it is provided that, for the supply of the wafer frame into the wafer holding device of the placement system, a functional test of each electronic component is carried out. During this functional test, non-functioning electronic components can be marked, which, for their part, are identified as marked by the component position identification device of the vacuum forceps holding device, so that said electronic components are not taken up by the vacuum forceps and transferred into a mounting position. The marked components may, however, also be removed from the perforated film before the supply of the wafer holding frame into the wafer holding device, so that only the electronic components which have been identified as functional are supplied to the placement system with the wafer holding frame.

In a further exemplary implementation of the method, each electronic component is provided with markings which serve for positioning in the placement system and are detected by the component position identification device of the vacuum forceps holding device during a placement operation in order to correctly position each component.

Since the electronic components are oriented with their active side and their external contacts with respect to the top side of the substrate during the placement operation, a further exemplary implementation of the method provides for said position markings to be arranged on the rear side of the electronic component.

A further exemplary implementation of the invention provides for the position markings to be arranged on the active side of the electronic component and the component position identification device to be provided with infrared detectors which can detect markings on the top side of the electronic component through the semiconductor wafer.

During the placement operation, it is provided that the contact pads of a ceramic plate or printed circuit board to be populated are uncovered, thus enabling direct contact to be made with the external contacts of the electronic component. Multilayer printed circuit boards or ceramic boards, which are provided with a plurality of planes of conductor tracks and through contacts arranged in between, may also be used as the printed circuit board or ceramic board.

The invention provides a placement system for carrying out the method. This placement system for populating a substrate with at least one electronic component of a semiconductor wafer divided into electronic components has a substrate holding device for receiving the substrate. Arranged above the substrate holding device is a wafer holding device for receiving a wafer holding frame, and a vacuum forceps holding device with a vacuum forceps is provided above the wafer holding device.

Both the substrate holding device and the wafer holding device can be positioned with respect to one another horizontally in the X direction and Y direction. As a result, a predetermined electronic component can be arranged directly above a predetermined mounting position of the substrate. The vacuum forceps holding device with its vacuum forceps can be finely adjusted in the X direction and Y direction with regard to the substrate holding device and can also be rotated about the Z axis and be finely adjusted. Furthermore, the vacuum forceps holding device is able to bring the vacuum forceps, in the region of the wafer holding frame, vertically in the Z direction, into a rest position, into a preliminary position and into a mounting position.

This placement system has the advantage that it can take individual predetermined electronic components directly from a semiconductor wafer divided into electronic components to a substrate for placement into a mounting position. The complicated process of taking up an electronic component from a transport belt and transferring it to a suitable position of a substrate is thus obviated, so that a predetermined position of the electronic component is maintained from the outset and overall the production sequence can be significantly shortened since the step of removal from a transport belt and the successive supply of individual electronic components into a placement system are obviated. This is additionally associated with a significant reduction of costs in a production line and, at the same time, it is possible to overcome transport problems hitherto connected with the transport belts with regard to positionally true placement, positionally true transport and positionally true removal.

In one embodiment of the placement system, the wafer holding frame holds a film with passage openings, a plurality of components of the semiconductor wafer separated into electronic components being arranged at the film under a respective one of the passage openings. A wafer holding frame of this type has the advantage that the entire semiconductor wafer with its curved waist sections, as are present after the separation into separate electronic components, may be arranged on the film in order to perform a singulation step for the electronic components. Furthermore, the wafer holding frame has the advantage that it can already be used with the perforated film for a separating device and reclamping of the film between different holding systems is obviated. Furthermore, the wafer holding frame may serve as a holding frame during a functional intermediate test in which the electronic components of the semiconductor wafer which do not conform to the specifications can be marked before the substrates are actually populated. The marked electronic components can be removed before the wafer holding frame is introduced into the placement system according to the invention, or remain on the wafer holding frame after placement has been carried out.

A further embodiment of the invention therefore provides for the wafer holding frame to be adapted to the diameter of a semiconductor wafer, which has the advantage that the curved waste sections of a wafer do not have to be removed beforehand in a separate method. What is more, the arrangement of the passage openings in the film of the wafer holding frame may correspond to the arrangement of the electronic components of the semiconductor wafer, so that at least in each case one passage opening is assigned to an electronic component.

In a further embodiment of the invention, the vacuum forceps holding device, in its rest position, is arranged above a passage opening of the perforated film. To that end, the wafer holding frame may be moved in the X direction and in the Y direction in the wafer holding device of the placement system until a functional electronic component is arranged under the vacuum forceps with the passage opening in the perforated film of the wafer frame arranged above said component. The vacuum forceps is able, in its preliminary position, through displacement from the rest position in the Z direction, to take up an electronic component—arranged under the passage opening—of the semiconductor wafer divided into electronic components by means of the vacuum being switched on. The electronic component thus held by the vacuum forceps can be brought into a mounting position predetermined on the substrate by further movement of the vacuum forceps in the Z direction. Since the vacuum forceps holding device is able to finely adjust the vacuum forceps in the X direction and in the Y direction and to rotate it about the Z axis, the electronic component can be finely adjusted by means of the vacuum forceps and the vacuum forceps holding device in the mounting position.

In order to check whether a functioning component is arranged in the correct position in the receiving region of the vacuum forceps, the vacuum forceps holding device has a component position identification device. This component position identification device detects all the components that are from a semiconductor wafer separated into electronic components and are marked as non-functional and communicates this knowledge to an evaluation circuit, so that no non-functioning electronic components are mounted on the substrate.

To that end, in one embodiment of the invention, the component position identification device is provided with a light pulse transmitter and a light pulse receiver which interact with the evaluation circuit for a position determination in the X direction and in the Y direction and can also identify a rotational error in the φ direction about the Z axis.

In a further embodiment of the invention, the placement system has a programmable controller, which causes the wafer holding device to bring one of the electronic components into the detection region of the component position identification device and causes the substrate holding device to bring the substrate into the predetermined position for mounting a component on the substrate. To that end, the programmable controller interacts with an X-Y table, which is part of the substrate holding device and carries the substrate during the placement operation. In addition, the programmable controller interacts with the wafer holding device in order to bring a suitable electronic component at the wafer holding frame into a position provided for placement.

In a further embodiment of the invention, the supply and discharge of substrate and wafer holding frame may be effected by means of corresponding supply and discharge devices, which are part of the placement system and thus enable an automatic production sequence during the placement operation. To that end, the supply and discharge device for the substrate has guide rails in which the substrate is guided into the placement system and is guided out of the placement system on the guide rails after placement.

For the placement system, use is made of a wafer holding frame which has a film with passage openings, a plurality of components of the semiconductor wafer separated into electronic components being arranged on the film in such a way that the components are in each case arranged under one of the passage openings of the film. This wafer frame does not have to carry all the electronic components of a semiconductor wafer, but rather may also have only the electronic components, which have been identified as functional. The positions of the defective electronic components then remain unoccupied on the perforated film.

In another embodiment of the wafer holding frame, the entire semiconductor wafer divided into electronic components, including its curved edge sections, is fitted on the perforated film, non-functional electronic components being marked in an identifiable manner for a component position identification device.

In the case of receiving a complete semiconductor wafer, the wafer holding frame has an internal diameter adapted to the diameter of the semiconductor wafer and the arrangement of the passage openings in the perforated film of the wafer holding frame corresponds to the arrangement of the electronic components of the semiconductor wafer. It is thus ensured that, in a completely positionally true manner, the electronic components are available for placement in a manner arranged in rows and columns in the wafer holding frame.

In a further embodiment of the wafer holding frame, it is provided that the diameter of the passage openings in the perforated film is adapted to the diameter of the vacuum forceps in such a way that, by means of the vacuum forceps, through the passage openings in the perforated film, it is possible to carry out a horizontal fine adjustment in the X direction and in the Y direction and a rotational movement about the Z axis of the electronic component with respect to the predetermined position on the substrate in the mounting position of the vacuum forceps. This adaptation of the wafer holding frame with its passage openings has the advantage that it is possible to carry out a fine adjustment of the electronic component with respect to the predetermined position on the substrate in the mounting position of the vacuum forceps without any problems and exact positioning of the electronic component and of its external contacts with respect to corresponding contact pads on the substrate thus becomes possible.

In order to hold the individual electronic component in the wafer holding frame, the diameter of the passage openings is smaller than the area diagonal of an individual electronic component. This ensures that, at least at the four corners of an electronic component, the latter is held at the perforated film and does not fall prematurely from the perforated film. In order from the outset to prevent an electronic component from falling from the perforated film, the wafer holding frame has a single-sided adhesive film, the single-sided adhesive layer of the film holding the electronic component in position until the vacuum forceps has taken up the electronic component.

A film with passage openings for use in a wafer holding frame has an arrangement of passage openings in rows and columns which are arranged in the same way as electronic components of a semiconductor wafer divided into electronic components. Films of this type may be prepared in large quantities for use in the placement system according to the invention, for each step size of electronic components on a semiconductor wafer it being necessary to provide corresponding films with corresponding step sizes of the passage openings.

The wafer holding frame may be embodied in two parts comprising rings that can be separated from one another, so that the perforated film can be inserted and clamped between the rings. For this purpose, the passage openings provided for holding the electronic components have a diameter, which is smaller than the diagonal of the electronic components. Consequently, not only does the step size of the passage openings have to be adapted to the arrangement of the electronic components on a semiconductor wafer but also the diameters of the respective passage openings have to be dimensioned correspondingly. What is more, the film has passage openings whose diameter is adapted to the vacuum forceps in such a way that fine adjustment movements of the vacuum forceps can be executed within the passage openings. This means that the passage openings are to be configured as large as possible taking account of the size of the electronic components in order to enable the vacuum forceps to effect displacements in the X and Y directions and rotational movements about the Z axis.

To summarize, it may be stated that, in the area of WSA development (wafer scale assembling), an essential aim of this development is, besides wafer level testing, that is to say testing of finished packaged chips at the wafer level, to provide a method and a system for the direct population of a substrate such as, for example, a printed circuit board or a ceramic plate. This essential aim is realized by the present subject matter of the invention. In this case, the chip is taken to the substrate directly from the wafer, which is itself seated on a suitable carrier material such as a film and has already been sawn, i.e. divided into individual electronic components, without the interposition of a die sorter (chip sorter).

In SMT production (surface mount technology), hitherto the individual chip or the individual electronic component, prior to placement, has been flipped (rotated through 180°), or supplied via an intermediate station to a placement head for example in the form of a vacuum forceps. This requires additional intermediate carrier means and intermediate positions before an electronic component of this type can be mounted on a predetermined position of a substrate. The method according to the invention now provides for the already tested electronic component to be placed directly on a substrate by a wafer clamped onto a film being positioned "headfirst", that is to say with the external contacts toward the bottom, above the substrate in such a way that the desired electronic component is situated above the installation location or the mounting position on the substrate. At this instant, a suction forceps or vacuum forceps moves onto the rear side of the electronic component, detaches the latter from the film and continues to hold it fixed by means of the vacuum.

Said vacuum forceps is situated on a device which can detect the orientation and position of the electronic component. This detection may be realized for example through the chip by means of an infrared camera and corresponding markings (or fiducals on the front side of the component) or by means of markings situated on the rear side of the electronic component. In order to correct the angle of rotation, the vacuum forceps can be rotated. The X-Y correction may be effected for example by moving the substrate. After position correction has been effected, the electronic component can be deposited on the substrate.

A preperforated film, for example, may be used as the carrier material on which the wafer is situated. This prevents the film from deforming to an excessively great extent, and electronic components from thus slipping, during the detachment of the chip and during the movement of the vacuum forceps downward. On the other hand, the vacuum forceps can move downward effortlessly through the preformed passage openings in order to detach the electronic components from the film without in the process destroying the film itself and thus jeopardizing the stability of the wafer holding frame. To that end, the vacuum forceps are provided with a long narrow neck, so that the latter fits through the passage openings of the film without deforming the film carrier material. The particular feature of this method is that there is no need for a further intermediate step between taking up an electronic component and placing the components. Furthermore, both coarse positioning of the wafer above the installation location or the mounting position on the substrate and fine positioning or fine adjustment are possible. What is more, the film according to the invention enables the carrier material that is used when sawing a semiconductor wafer to be completely replaced. Other features which are considered as characteristic for the invention are set forth in the appended claims.

Although the invention is illustrated and described herein as embodied in a placement system for populating a substrate with electronic components, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
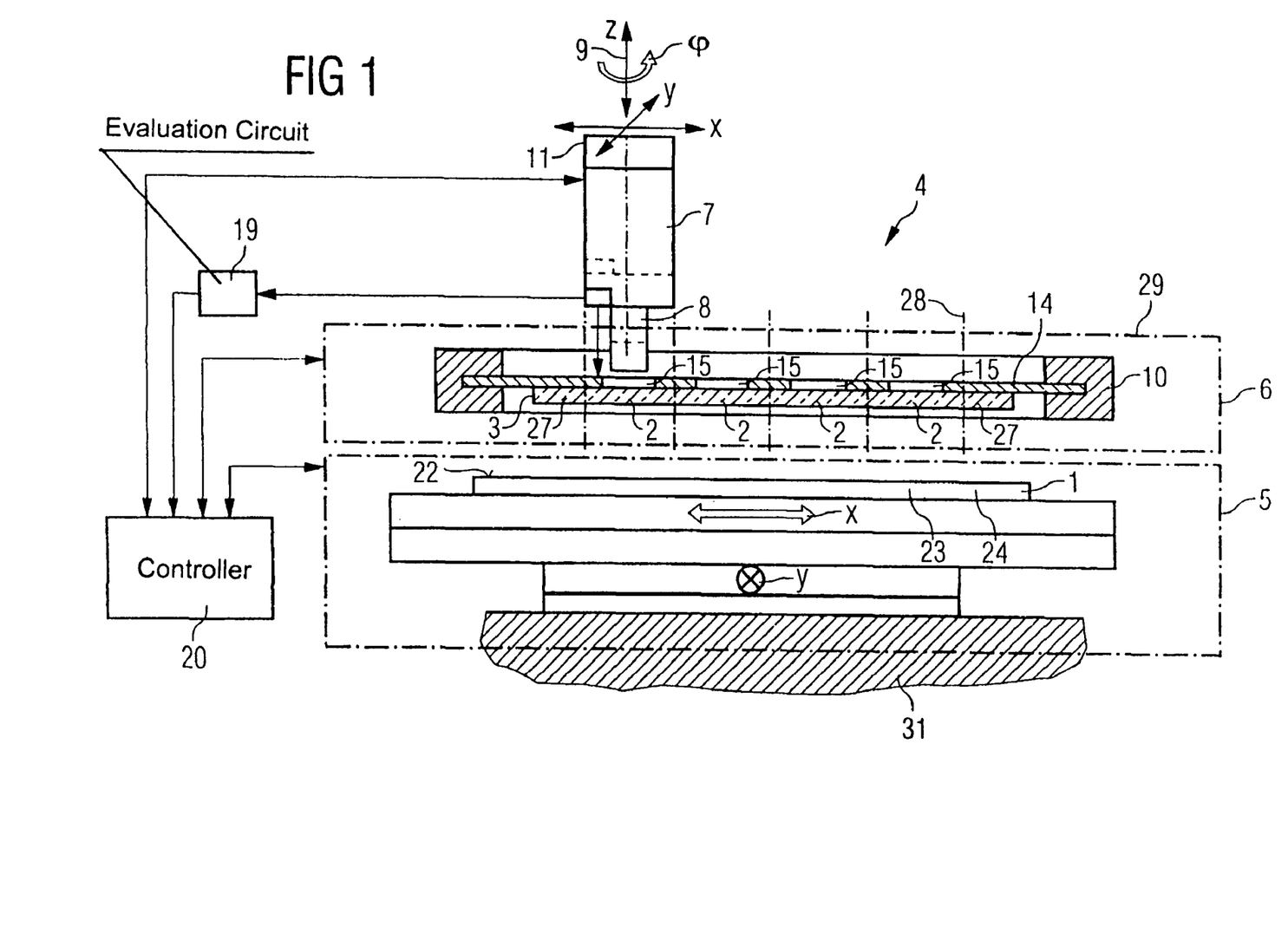
FIG. 1 is a diagrammatic and partly schematic view of a placement system forming an embodiment of the invention.

Referring now to the figures of the drawing in detail and first, particularly, to FIG. 1 thereof, there is shown a diagrammatic sketch of a placement system 4 in an exemplary implementation of the present invention. In the figure, reference numeral 1 denotes a substrate. The reference numeral 2 denotes an electronic component of a semiconductor wafer 3 divided into electronic components 2. The reference numeral 5 denotes a substrate holding device 5 for receiving the substrate 1. The reference numeral 6 denotes a wafer holding device 6 arranged above the substrate holding device 5 and serving for receiving a wafer holding frame 10. The reference numeral 7 denotes a vacuum forceps holding device arranged above the wafer holding device 6. The reference numeral 16 denotes a component position identification device, which, in this embodiment, has a light pulse transmitter 17 and a light pulse receiver 18 which interact with an evaluation circuit 19. The evaluation circuit 19 communicates the component position result to a programmable controller 20, which interacts both with the substrate holding device 5 and with the wafer holding device 6 and also with the vacuum forceps holding device 7 and controls the overall sequence of the placement operation.

In this embodiment of the invention, the substrate 1 is arranged on a horizontal X and Y table, which positions the substrate holding device in the X direction and Y direction. The X-Y table is driven by stepper motors which operate in coarse step sizes of 1 mm and fine step sizes in a grid of 2 μm. Consequently, it is possible to set a preadjustment or presetting of the substrate 1 with respect to the vacuum forceps holding device 7.

Contact pads are arranged on the surface 22 of the substrate 1, the structure of the contact pads being adapted to the structure of the external contacts of the electronic components 2. The electronic components correspond to a semiconductor chip in terms of their areal extent and have a rewiring film, which carries corresponding external contacts, on the active top side of the semiconductor chip. In this embodiment of the invention, said external contacts point in the direction of the top side 22 of the substrate 1. To that end, the semiconductor wafer 3 divided into electronic components 2 is arranged in a manner suspended from a perforated film 14 in a wafer holding frame 10. Said wafer holding frame 10 can be positioned in the X direction and Y direction by means of a wafer holding device 6, so that a functional electronic component can be set with respect to the predetermined position of the contact pads on the top side 22 of the substrate 1.

As soon as the wafer holding frame 10 and the substrate 1 have been coarsely positioned in the X direction and in the Y direction in the placement system, the component position identification device 16 can check whether the electronic component is marked as non-functional. Furthermore, the component position identification device of the vacuum forceps holding device, by way of a fine adjustment in the X direction, in the Y direction, and by rotation through an angle φ about the Z axis of the vacuum forceps, can finely adjust the vacuum forceps according to corresponding markings on the electronic component before the vacuum forceps is moved from the rest position 11, represented by broken lines in FIG. 1, into the preliminary position 12. In the preliminary position, with the vacuum forceps 8 being introduced into the passage opening 15 of the perforated film 14, said vacuum forceps can take up an electronic component 2 and detach it from the perforated film 14.

By means of further vertical movement of the vacuum forceps holding device 7 in the Z direction, the electronic component can be lowered as far as the surface 22 of the substrate 1. The substrate 1 itself may be a printed circuit board 23 or a ceramic plate 24. In addition, both the printed circuit board 23 and the ceramic plate 24 may be present in a multilayer embodiment, the multilayer nature relating to the presence of a plurality of conductor track planes of the substrate.

The driving of the different positions of the electronic components for the purpose of displacing the wafer holding frame 10 is instigated by the programmable controller 20. To that end, said programmable controller 20 acts on corresponding stepper motors, which carry out a stepwise horizontal movement of the wafer holding device 6 in the X direction and in the Y direction. In this embodiment, said stepper motors have a coarse step sequence of 1 mm step size and, in a fine setting phase, a step sequence of 2 μm. The programmable controller 20 also controls the displacement of the vacuum forceps holding device 7 for fine adjustment in the X direction and Y direction taking account of the component position signals which are made available by the component position identification device via the evaluation circuit 19. In addition, the programmable controller controls the fine setting of the direction of rotation of the vacuum forceps holding device 7 through the angle φ.

The dash-dotted lines through the semiconductor wafer 3 indicate the position of the separating tracks 28 for the divided electronic components 2. The line 29 dotted with a double dot indicates the region of the wafer holding device 6, and the broken line indicates the region of the substrate holding device 5, which, for its part, is arranged on a support 31.

Figure 2:
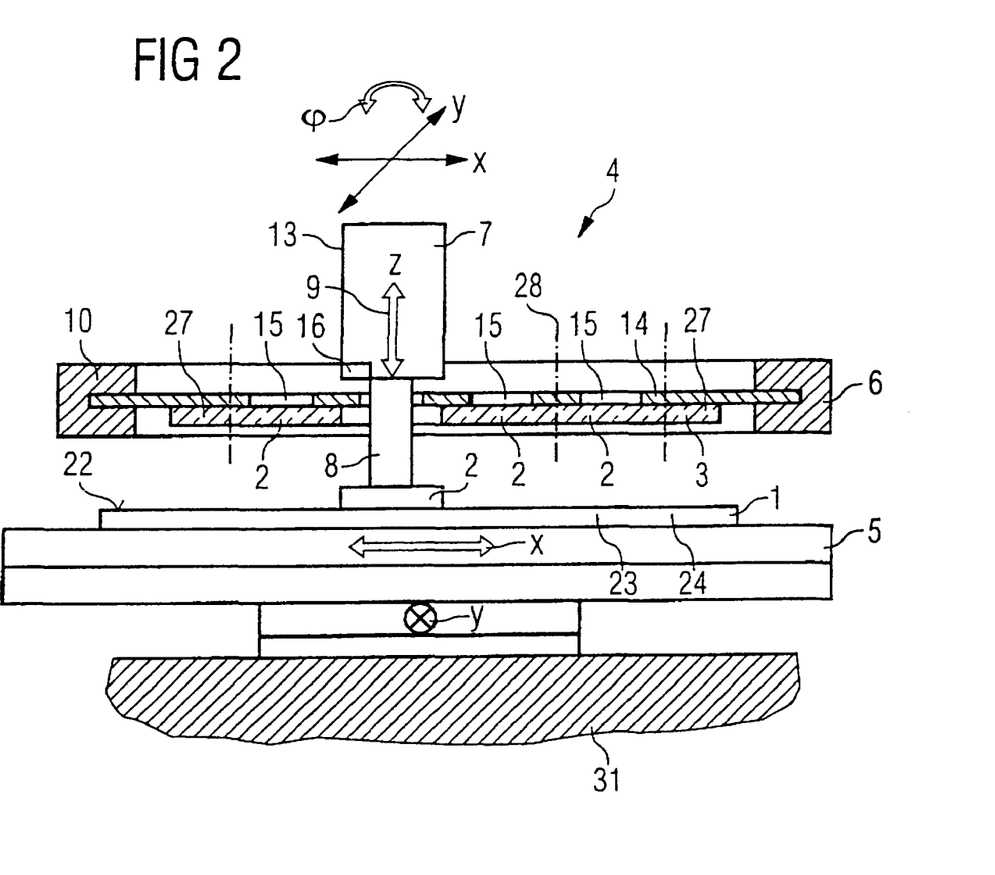
FIG. 2 is a diagrammatic side view of a placement system forming an exemplary embodiment of the invention with a vacuum forceps in the mounting position.

FIG. 2 shows a diagrammatic sketch of a placement system 4 of an embodiment of the invention with a vacuum forceps 8 in the mounting position 13. Components with functions identical to those in FIG. 1 are denoted by identical reference symbols and are not explained separately.

The number of electronic components in the embodiment according to FIG. 2 is restricted here only in principle to four for the wafer 3 in one direction. The wafer 3 may have an arbitrary number of electronic components arranged in rows and columns. This number of electronic components 2 may be between 100 and 2,000 given a semiconductor wafer having a diameter of 300 mm. In accordance with the number of electronic components, corresponding passage openings 15 are provided in the perforated film 14 carrying the semiconductor wafer 3. Said passage openings are also arranged in rows and columns, so that each electronic component is arranged under a passage opening 15 of this type.

The edge sections 27 of the semiconductor wafer 3 do not carry complete electronic components 2 and are consequently waste. The edge sections 27 may be detached from the film 14 before the wafer holding frame is actually introduced into the placement system, or they may remain on the film through to the placement of all the functional electronic components of the semiconductor wafer 3 separated into electronic components onto corresponding substrates. The same applies to non-functional electronic components which have been marked correspondingly during a functional intermediate test. The functionality or non-functionality or the marking is signaled by the component position identification device 16 to a programmable controller (not shown) via an evaluation circuit (not shown), so that no non-functional electronic components are taken into the mounting position 13 through the vacuum forceps holding device 7.

In the mounting position 13, the electronic component, with the aid of the vacuum forceps holding device 7, can be finely adjusted in the X direction and in the Y direction and be rotated about the Z axis 9 and finely adjusted. By means of this fine adjustment, the external contacts of the electronic component 2 can be taken into exact assignment to corresponding contact pads on the substrate 1. A heating device (not shown) may heat either the electronic component 2 or the substrate 1 in order to effect curing of a conductive adhesive or in order to effect soft soldering of the external contacts of the electronic component on the contact pads of the top side 22 of the substrate 1.

The passage opening 15 has a sufficient diameter in order that the vacuum forceps can be finely adjusted in the X and Y directions in the passage opening 15. Furthermore, the area of the passage opening 15 is less than the area of the electronic component. The dashed-dotted lines in FIG. 1 and FIG. 2 show the position of the separating tracks 28 in the semiconductor wafer 3 for the divided electronic components.

Figure 3:
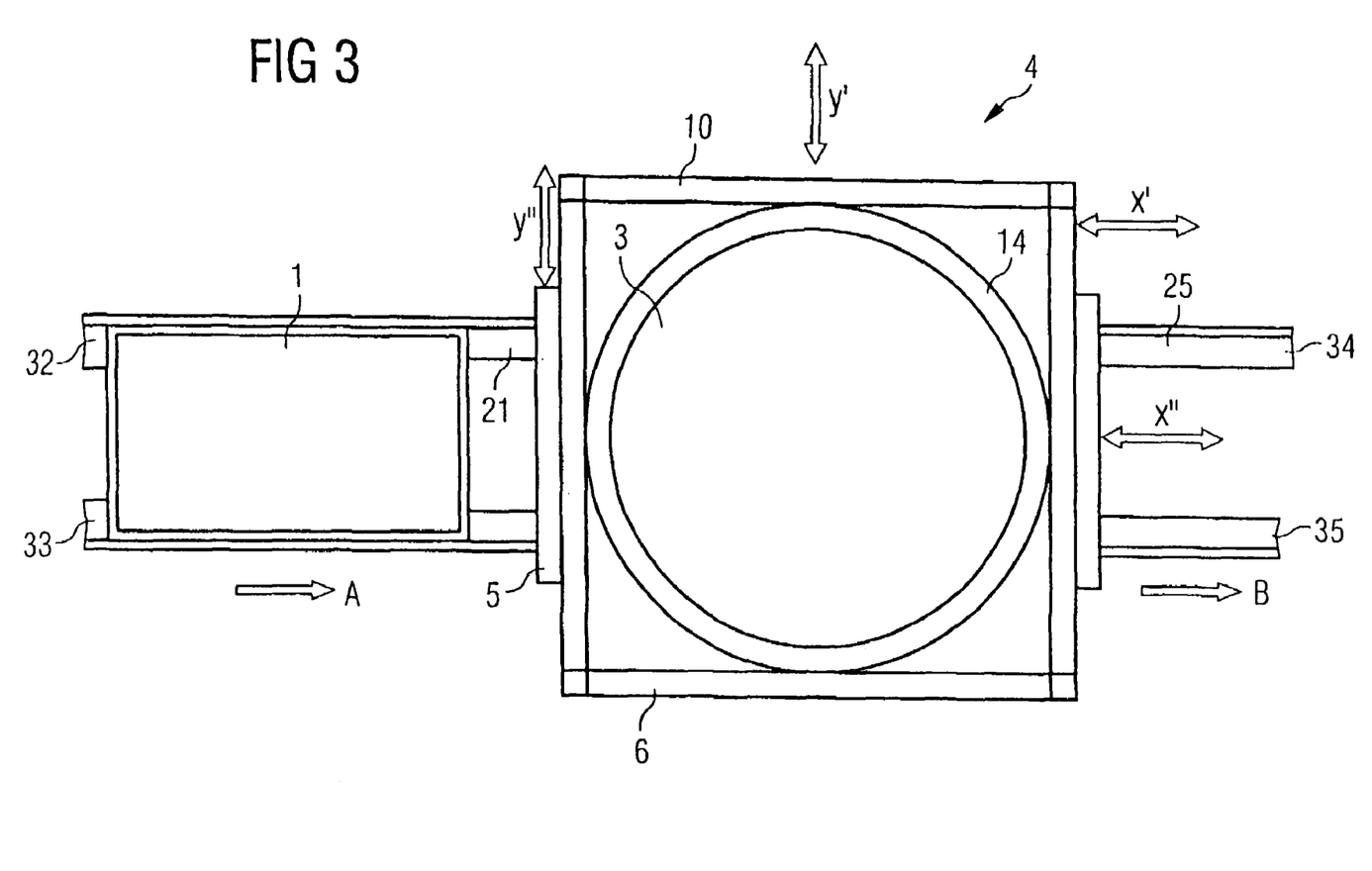
FIG. 3 is a diagrammatic plan view of a placement system according to a further embodiment of the invention.

FIG. 3 shows a diagrammatic plan view of a placement system of a further embodiment of the invention. Components with functions identical to those in the previous figures are denoted by identical reference symbols and are not explained separately.

This diagrammatic plan view is greatly simplified by the omission of the vacuum forceps holding device shown in FIGS. 1 and 2. This further embodiment of the invention shows a supply device 21 and a discharge device 25 for the substrate 1, which in this case is supplied to the substrate holding device 5 on guide rails 32 and 33 and is guided out of the placement system 4 on guide rails 34 and 35 of the discharge device 25. The substrate holding device 5 can be positioned in arrow direction Y" and in X" in order to bring the substrate into a predetermined position for placement. Arranged above the substrate holding device 5 is a wafer holding device with a wafer holding frame 10, the wafer holding frame 10 carrying the wafer 3 divided into electronic components on a perforated film 14. The wafer holding frame 10 can be displaced by means of the wafer holding device in arrow direction Y' and X' in order to orient a functional electronic component to the position on the substrate 1.

The embodiments of a placement system as shown in FIGS. 1-3 are used to carry out a method for populating a substrate with electronic components having the following method steps.

Firstly, a wafer holding frame 10 with a perforated film 14 clamped in the wafer holding frame is provided. Said film 14 has passage openings 15 arranged in rows and columns. In this case, the arrangement of the passage openings 15, the step size of the passage openings 15 and the area of the passage openings 15 are adapted to the electronic components 2—arranged in rows and columns—of a semiconductor wafer separated into electronic components 2. Said semiconductor wafer 3 is applied to the perforated film 14 as carrier material before the semiconductor wafer 3 is actually separated into electronic components 2, and is separated into corresponding electronic components in a separating device. A wafer holding frame 10 prepared in this way is provided for placement in a corresponding placement system 4. Furthermore, a substrate 1 with predetermined positions for the application of an electronic component 2 is provided. For placement purposes, the wafer holding frame 10 is introduced into a positioning wafer holding device 6 and the substrate 1 is introduced into a positioning substrate holding device 5. Afterward, the wafer holding frame 10 and the substrate 1 are positioned horizontally in the X and Y directions with respect to one another in such a way that a functional electronic component 2 is arranged in a predetermined position above the substrate 1.

After the orientation of substrate 1 and electronic component 2 or semiconductor wafer 3, a vacuum forceps 8 moves in the Z direction vertically through the passage opening 15 of the film 14, said passage opening being situated above the electronic component, and carries along the corresponding electronic component 2 from a preliminary position and takes the electronic component 2 into a mounting position on the substrate 1. In said mounting position, the electronic component 2 is finely adjusted in the X direction and in the Y direction by means of the vacuum forceps holding device 7 and is also rotated about the Z axis and finely adjusted at an angle φ in the process.

The electronic component 2 can be fixed on the substrate 1 in the predetermined mounting position in various ways. By way of example, the substrate 1 can be heated in order to cure a conductive adhesive, arranged on contact pads of the substrate 1 in the predetermined position, by heating or it is possible to heat the electronic component 2, for example by means of laser beams, to such an extent as to effect soft soldering of the external contacts of the electronic component 2 on the contact pads of the substrate 1. The entire placement operation is controlled and monitored by a programmable control unit 20 and supported by a component position identification device 16 arranged at the vacuum forceps holding device 7.

We claim:

1. A placement system for populating a substrate with at least one electronic component of a semiconductor wafer divided into electronic components, the placement system comprising:
a substrate holding device for receiving the substrate;
a wafer holding device disposed above said substrate holding device and adapted to receive a wafer holding frame;
said substrate holding device and said wafer holding device being disposed to be positioned with respect to one another horizontally in an X direction and a Y direction;
a vacuum forceps holding device disposed above said wafer holding device, said vacuum forceps holding device having a vacuum forceps, which can be finely adjusted in the X direction and the Y direction with regard to said substrate holding device and disposed to be rotatable and finely adjustable about a Z axis extending in a Z direction; and
said vacuum forceps holding device being configured to move said vacuum forceps, in a region of said wafer holding frame, vertically in the Z direction into a rest position, into a preliminary position, and into a mounting position.

2. The placement system according to claim 1, wherein said wafer holding frame holds a film formed with passage openings, and a plurality of components of the semiconductor wafer separated into electronic components are disposed at said film with the components respectively arranged under one of said passage openings of said film.

3. The placement system according to claim 2, wherein said wafer holding frame is adapted to a diameter of a semiconductor wafer, and a configuration of said passage openings in said film of said wafer holding frame corresponds to an arrangement of the electronic components of the semiconductor wafer.

4. The placement system according to claim 2, wherein said vacuum forceps of said vacuum forceps holding device is disposed above a respective passage opening in the rest position, and said vacuum forceps, in the preliminary position thereof, is enabled to take up an electronic component of the semiconductor wafer disposed under the respective passage opening in the Z direction, and said vacuum forceps with the electronic component thus taken up, in the mounting position of the vacuum forceps, is finely adjustable and positionable in a predetermined position above the substrate.

5. The placement system according to claim 1, wherein said vacuum forceps holding device has a component position identification device.

6. The placement system according to claim 5, wherein said component position identification device is configured to detect components of the semiconductor wafer that are marked as non-functional.

7. The placement system according to claim 5, wherein said component position identification device has a light pulse transmitter, a receiver, and an evaluation circuit for a position determination in the X direction and the Y direction.

8. The placement system according to claim 5, which further comprises a programmable controller connected to said wafer holding device and configured to cause said wafer holding device to bring one of the electronic components into a defined detection region of said component position identification device, and to cause said substrate holding device to bring the substrate into a predetermined position for mounting an electronic component on a top side of the substrate.

9. The placement system according to claim 1, wherein said placement system has a feed device for supplying substrates to said substrate holding device and a discharge device for discharging substrates from said substrate holding device.

10. The placement system according to claim 1, wherein said placement system has a feed device for supplying wafer holding frames to said wafer holding device and a discharge device for discharging wafer holding frames from said wafer holding device.

11. A wafer holding frame useful in a placement system for populating a substrate with at least one electronic component of a semiconductor wafer divided into electronic components, the placement system including, a substrate holding device for receiving the substrate, a wafer holding device disposed above the substrate holding device and adapted to receive the wafer holding frame, the substrate holding device and the wafer holding device being disposed to be positioned with respect to one another horizontally in an X direction and a Y direction, a vacuum forceps holding device disposed above the wafer holding device, the vacuum forceps holding device having a vacuum forceps, which can be finely adjusted in the X direction and the Y direction with regard to the substrate holding device and disposed to be rotatable and finely adjustable about a Z axis extending in a Z direction, and the vacuum forceps holding device being configured to move the vacuum forceps, in a region of the wafer holding frame, vertically in the Z direction into a rest position, into a preliminary position, and into a mounting position, the wafer holding frame comprising:
- a film having a plurality of passage openings formed therein; and
- a plurality of components of the semiconductor wafer separated into individual electronic components respectively disposed under one of said passage openings of said film.

12. The wafer holding frame according to claim 11, wherein the wafer holding frame has an inner diameter adapted to a diameter of a semiconductor wafer and said passage openings in said film are arranged to correspond to an arrangement of the electronic components of the semiconductor wafer.

13. The wafer holding frame according to claim 11, wherein a diameter of the passage openings is adapted to a diameter of the vacuum forceps such that, the vacuum forceps is enabled, through a respective passage opening, to carry out a fine adjustment in the X direction and in the Y direction and a rotational movement about the Z axis of the electronic component with respect to the predetermined position on the substrate in the mounting position of the vacuum forceps.

14. The wafer holding frame according to claim 11, wherein a diameter of said passage openings is smaller than an area diagonal of the electronic component.

15. The wafer holding frame according to claim 11, wherein said film of the wafer holding frame is a single-side adhesive film.

16. A film for a wafer holding frame the wafer holding frame being useful in a placement system for populating a substrate with at least one electronic component of a semiconductor wafer divided into electronic components, the placement system including, a substrate holding device for receiving the substrate, a wafer holding device disposed above the substrate holding device and adapted to receive the wafer holding frame, the substrate holding device and the wafer holding device being disposed to be positioned with respect to one another horizontally in an X direction and a Y direction, a vacuum forceps holding device disposed above the wafer holding device, the vacuum forceps holding device having a vacuum forceps, which can be finely adjusted in the X direction and the Y direction with regard to the substrate holding device and disposed to be rotatable and finely adjustable about a Z axis extending in a Z direction, and the vacuum forceps holding device being configured to move the vacuum forceps, in a region of the wafer holding frame, vertically in the Z direction into a rest position, into a preliminary position, and into a mounting position, the film comprising:
- a plurality of passage openings formed therein, a plurality of components of the semiconductor wafer separated into individual electronic components respectively disposed under one of the passage openings of the film; and
- the plurality of passage openings being configured in columns and rows corresponding to columns and rows of electronic components of the semiconductor wafer divided into the electronic components.

17. The film according to claim 16, wherein said passage openings of the film have a smaller diameter than a diagonal of the electronic components.

18. The film according to claim 16, wherein said passage openings in the film are adapted to a diameter of the vacuum forceps to enable the vacuum forceps to execute fine adjustment movements in the X and Y directions within the passage openings.

* * * * *